United States Patent
Müller

(10) Patent No.: US 12,464,781 B2
(45) Date of Patent: Nov. 4, 2025

(54) MEMORY CELL, MEMORY CELL ARRANGEMENT, AND METHODS THEREOF

(71) Applicant: Ferroelectric Memory GmbH, Dresden (DE)

(72) Inventor: Stefan Ferdinand Müller, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 499 days.

(21) Appl. No.: 17/749,111

(22) Filed: May 19, 2022

(65) Prior Publication Data

US 2022/0376114 A1 Nov. 24, 2022

Related U.S. Application Data

(60) Provisional application No. 63/191,193, filed on May 20, 2021.

(51) Int. Cl.
*H10D 64/27* (2025.01)
*H10B 51/30* (2023.01)
*H10D 30/69* (2025.01)

(52) U.S. Cl.
CPC ........... *H10D 30/701* (2025.01); *H10B 51/30* (2023.02); *H10D 64/513* (2025.01)

(58) Field of Classification Search
CPC .......... H01L 29/4236; H01L 27/11502; H01L 29/6684; H10B 51/30; H10B 53/00; H10B 51/00; H01G 7/06
See application file for complete search history.

(56) References Cited

U.S. PATENT DOCUMENTS

| | | | |
|---|---|---|---|
| 2003/0071292 A1* | 4/2003 | Hsu | H01L 29/40111 257/295 |
| 2004/0042290 A1* | 3/2004 | Tarui | H10D 30/701 257/E21.208 |
| 2006/0054948 A1* | 3/2006 | Yamada | H10B 53/30 257/295 |
| 2017/0250196 A1* | 8/2017 | Kang | H01L 29/516 |
| 2020/0027493 A1* | 1/2020 | Müller | G11C 16/04 |

* cited by examiner

*Primary Examiner* — Chad M Dicke
*Assistant Examiner* — Valerie N Newton
(74) *Attorney, Agent, or Firm* — Synergy IP Group AG; Natalie Albrecht

(57) ABSTRACT

Various aspects relate to a memory cell including: a field-effect transistor structure, the field-effect transistor structure including a gate structure to control a current flow in a channel, the gate structure including a gate isolation and a floating gate, wherein at least a part of the gate structure extends from a surface of a semiconductor layer into the semiconductor layer; and a capacitive memory structure, the capacitive memory structure including at least two electrodes and a spontaneously polarizable layer disposed between the at least two electrodes, wherein one of the at least two electrodes is in direct physical contact with the floating gate of the field-effect transistor structure, and wherein the spontaneously polarizable layer is disposed over the surface of the semiconductor layer.

20 Claims, 9 Drawing Sheets

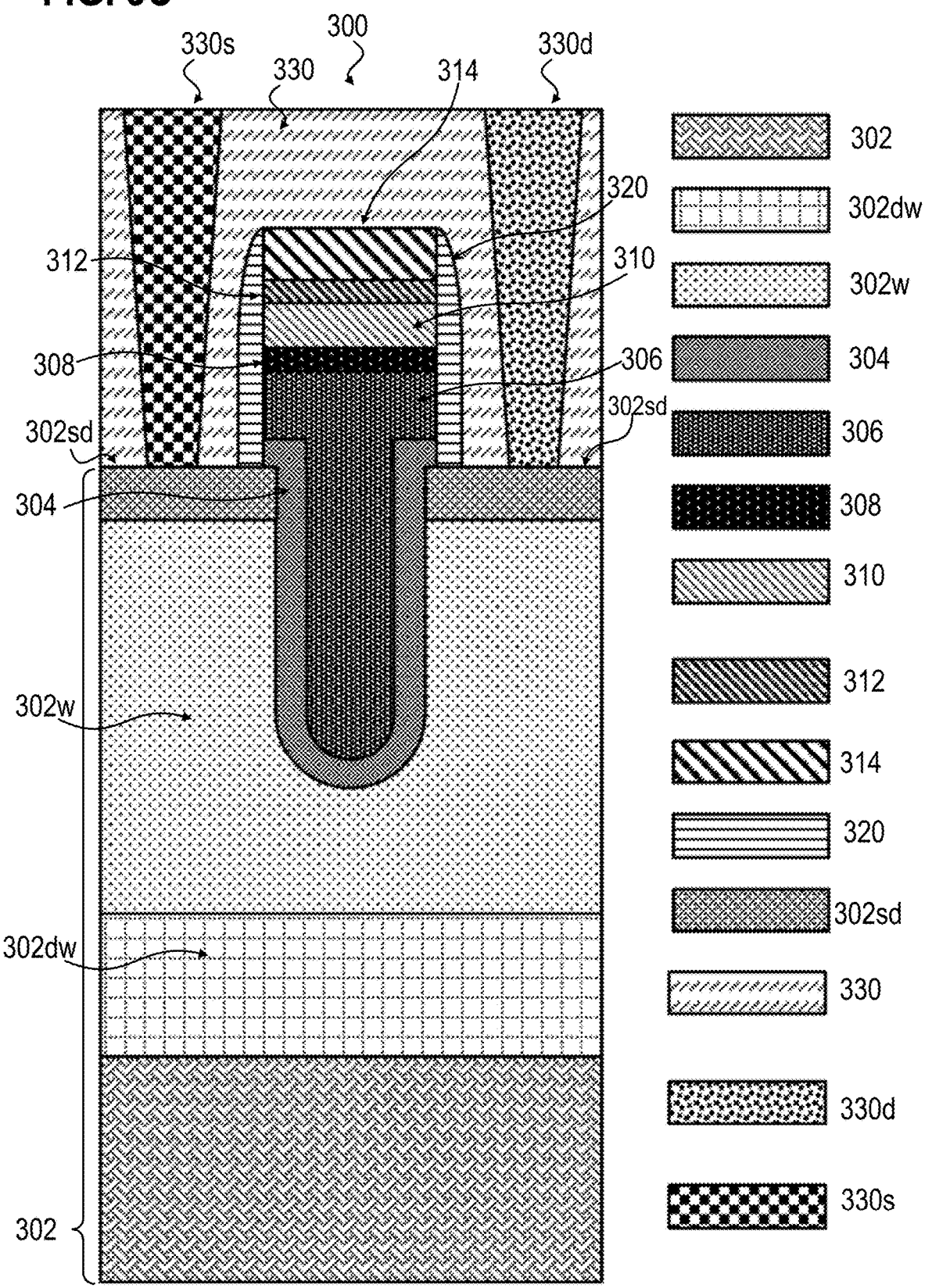

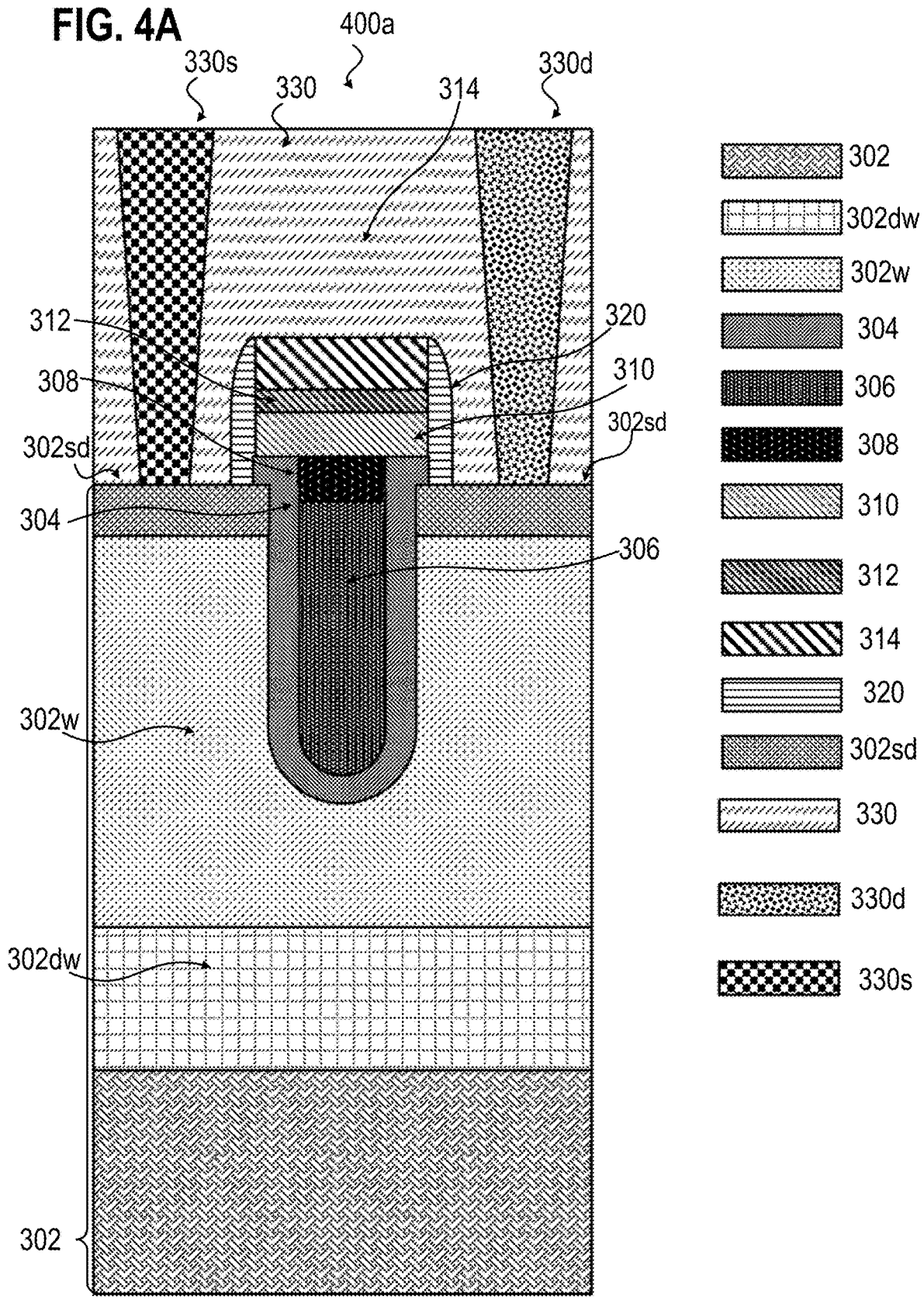

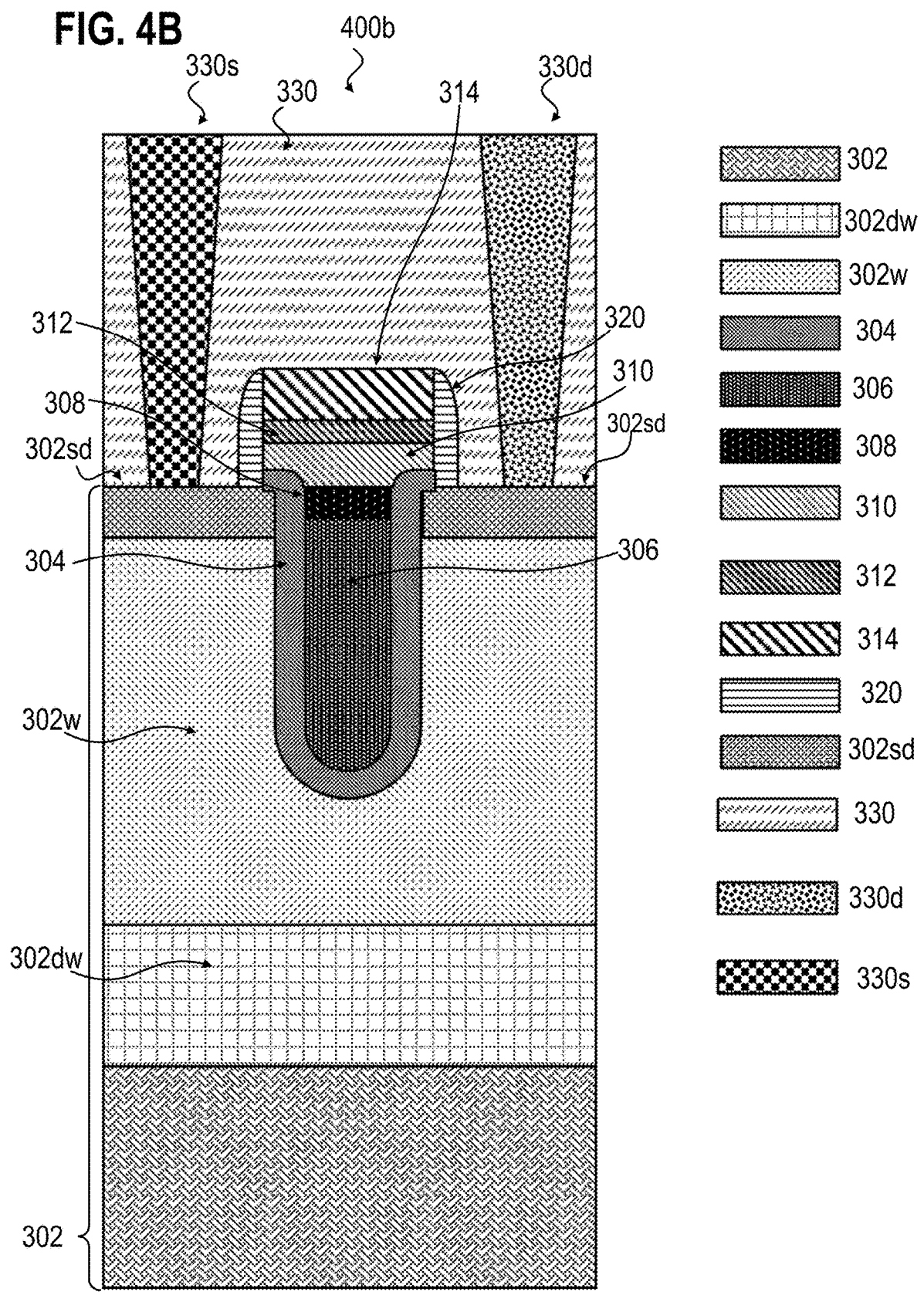

MEMORY CELL, MEMORY CELL ARRANGEMENT, AND METHODS THEREOF

BENEFIT CLAIM

This application claims the benefit under 35 U.S.C. § 119(e) of provisional application 63/191,193, filed May 20, 2021, the entire contents of which is hereby incorporated by reference for all purposes as if fully set forth herein. The applicants hereby rescind any disclaimer of claim scope in the parent applications or the prosecution history thereof and advise the USPTO that the claims in this application may be broader than any claim in the parent applications.

TECHNICAL FIELD

Various aspects relate to a memory cell, a memory cell arrangement, and methods thereof, e.g., a method for manufacturing a memory cell and a method for manufacturing a memory cell arrangement.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may have at least two states representing a logic 1 and a logic 0. The information may be maintained (stored) until the state of the memory cell is changed, e.g., in a controlled manner. The information stored in the memory cell may be read by determining the state of the memory cell. At present, various semiconductor process flows have been established to integrate various types of memory cells. The memory cells may be, for example, integrated on a wafer or a chip together with one or more logic circuits. In this case, the process flow for integrating the memory cell and the logic circuit may be adapted to manufacture both in an efficient way.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 3A, FIG. 3B, and FIG. 3C show schematically various aspects of a memory cell;

FIG. 4A and FIG. 4B show schematically various aspects of a memory cell;

DESCRIPTION

Figure 1:
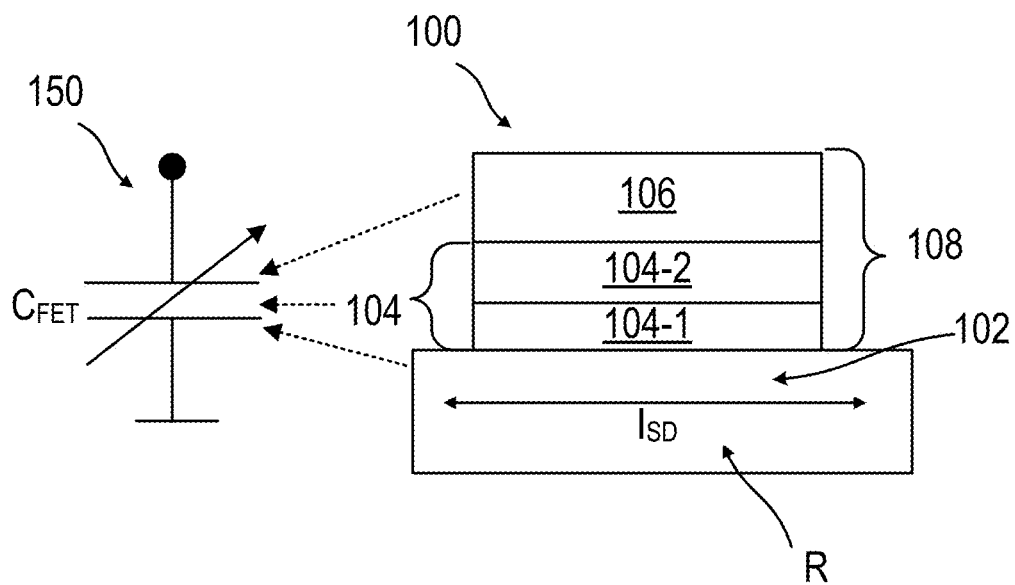
FIG. 1 shows schematically a field-effect transistor, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory capacitor). However, it may be understood that aspects described in connection with methods may similarly apply to the devices, and vice versa.

According to various aspects, a functional layer of a memory cell or memory cell structure may include or may be made of a polarizable material, e.g., a spontaneously polarizable material (such as an anti-ferroelectric and/or ferroelectric material, as examples). An anti-ferroelectric material may show a hysteresis in the (voltage dependent) polarization, however, with no remanent polarization remaining in the case that no voltage drop is present over the anti-ferroelectric material. A ferroelectric material may show a hysteresis in the (voltage dependent) polarization, however, with a remanent polarization remaining even in the case that no voltage drop is present over the ferroelectric material. A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristics of the polarization) may be analyzed using capacity spectroscopy, e.g., via a static (C-V) and/or time-resolved measurement or by polarization-voltage (P-V) or positive-up-negative-down (PUND) measurements.

The term "spontaneously polarizable material" or "spontaneous-polarizable material" may be used herein with reference to a material that has a polarization capability in addition to its dielectric polarization capability. A spontaneously-polarizable material may be or may include a spontaneously-polarizable material that shows a remanence, e.g., a ferroelectric material, and/or a spontaneously-polarizable material that shows no remanence, e.g., an anti-ferroelectric material.

The term "remanently polarizable" or "remanent-polarizable" with reference to a layer, a portion, a structure, a memory cell, as examples, may be understood as a layer that exhibits a remanent-polarization capability (e.g., in addition to a dielectric polarization capability and/or a non-remanent-polarization capability). A remanent-polarizable layer, a remanent-polarizable structure, a remanent-polarizable memory cell, a remanent-polarizable portion (only as examples) may include, in some aspects, a material that is remanently polarizable (i.e., that shows a remanence of the spontaneous polarization), e.g., a ferroelectric material. In other aspects, a remanent-polarizable layer, a remanent-polarizable structure, a remanent-polarizable memory cell, a remanent-polarizable portion (only as examples) may include a material that is spontaneously polarizable and that shows no remanence, e.g., an anti-ferroelectric material under the additional conditions, that measures are implemented to generate an internal electric-field within the anti-ferroelectric material. An internal electric-field within an anti-ferroelectric material may be caused (e.g., applied, generated, maintained, as examples) by various measures, e.g., by implementing floating nodes that may be charged to voltages different from zero volts, e.g., by implementing charge storage layers, e.g., by using doped layers, e.g., by using electrode layers that adapt electronic work-functions to generate an internal electric field, only as examples.

In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. The remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

Various aspects are related to a memory cell including a field-effect transistor structure and a capacitor structure, wherein the capacitor structure may include a spontaneously polarizable material. Various aspects are related to a memory cell including a field-effect transistor structure and a capacitor structure, wherein the capacitor structure may include a spontaneously polarizable layer, as example. It is noted that various technologies, e.g., semiconductor technology based on silicon or any other semiconducting material (e.g., a semiconducting organic material, e.g., a carbon based material, as examples) are suitable to implement any desired field-effect transistor structure and any desired capacitor structure. Only as an example, a combination of a field-effect transistor (FET) structure and a ferroelectric capacitor (FeCAP) structure are described in the following as examples for a possible implementation of a memory cell or memory cell structure. The combination of a FET and a FeCAP (e.g., a FeCAP having one of its electrodes coupled to a gate of the FET or a FeCAP integrated into a gate of a FET) may be referred to as ferroelectric field-effect transistor (FeFET).

It is noted that various aspects are described with reference to a FeFET that includes a ferroelectric capacitor structure (e.g., a capacitor having a remanent-polarizable, e.g., a ferroelectric, material as a functional layer disposed between two capacitor electrodes). However, a similar function and structure can be implemented by using a spontaneously polarizable layer as the functional layer of a capacitor structure that shows no or no substantial remanence, e.g., based on an anti-ferroelectric material.

FIG. 1 shows a schematic functioning of a field-effect transistor 100, according to various aspects. The field-effect transistor 100 may include a gate structure 108 (e.g., including one or more gate layers), wherein the gate structure 108 may include a gate isolation 104 (e.g., including one or more isolation layers) and a gate electrode 106 (e.g., including one or more electrode layers). The gate structure 108 is illustrated exemplarily as a planar gate stack, however, it may be understood that the planar configuration shown in FIG. 1 is an example, and other field-effect transistor designs may include a gate structure 108 with a non-planar shape, for example a trench (also referred to as recess) gate transistor design, a vertical field-effect transistor design, or other designs. The gate structure 108 may define (e.g., be adjacent to) a channel region 102, e.g., provided in a semiconductor region (e.g., in a semiconductor layer, in a semiconductor die, etc.). The gate structure 108 may allow for a control of an electrical behavior (e.g., resistance) of the channel region 102. The gate structure 108 may, for example, be used to control (e.g., allow or prevent) a current flow in the channel region 102. In some aspects, the gate structure 108 may, for example, allow to control (e.g., allow or prevent) a source/drain current, $I_{SD}$, from a first source/drain region of the field-effect transistor 100 to a second source/drain region of the field-effect transistor 100. The source/drain regions are provided in or adjacent to the channel. The channel region 102 and the source/drain regions may be formed, e.g., via doping one or more semiconductor materials or by the use of intrinsically doped semiconductor materials, within a layer and/or over a layer. In some aspects, the gate structure 108 may control (e.g., increase or reduce) an electrical resistance, R, of the channel region 102 and, accordingly, control the amount of current that may flow through the channel region 102. With respect to the operation of the field-effect transistor 100, a voltage may be provided at (e.g., supplied to) the gate electrode 106 to control the current flow, $I_{SD}$, in the channel region 102, the current flow, $I_{SD}$, in the channel region 102 being caused by voltages supplied via the source/drain regions.

The gate electrode 106 may include an electrically conductive material, for example, polysilicon, a metal (e.g., aluminum), etc. In some aspects, the gate electrode 106 may include any suitable electrically conductive material, e.g., a metal, a metal alloy, a degenerate semiconductor (in other words a semiconductor material having such a high level of doping that the material acts like a metal and not anymore semiconducting). According to various aspects, the gate electrode 106 may include one or more electrically conductive portions, layers, etc. The gate electrode 106 may include, for example, one or more metal layers (also referred to as a metal gate), one or more polysilicon layers (also referred to as poly-Si-gate), etc. A metal gate may include, for example, at least one work-function adaption metal layer disposed over the gate isolation 104 and an additional metal layer disposed over the work-function adaption metal layer. A poly-Si-gate may be, for example, p-type doped or n-type doped.

According to various aspects, the gate isolation 104 may be configured to provide an electrical separation of the gate electrode 106 from the channel region 102 and further to influence the channel region 102 via an electric field generated by the gate electrode 106. The gate isolation 104 may include one or more electrically insulating portions, layers, etc., as described in more detail below.

Some examples of the gate isolation 104 may include at least two (e.g., two or more) layers (also referred to as gate isolation layers) differing in their material from each other. The at least two gate isolation layers may include, for example, a first gate isolation layer 104-1 (e.g., a first dielectric layer including a first dielectric material) and a second gate isolation layer 104-2 (e.g., a second dielectric layer including a second dielectric material distinct from first dielectric material). The second gate isolation layer 104-2 may be disposed over the first gate isolation layer 104-1. Illustratively, the first gate isolation layer 104-1 may be disposed closer to the channel region 102 of the field-effect transistor 100 compared to the second gate isolation layer 104-2. The first gate isolation layer 104-1 may be disposed directly on the channel region 102 and may provide an interface for forming the second gate isolation layer 104-2. In some aspects, the first gate isolation layer 104-1 may be referred to as buffer layer.

As illustrated by the circuit equivalent 150 in FIG. 1, a first capacitance, $C_{FET}$, may be associated with the field-effect transistor 100. Illustratively, the channel region 102, the gate isolation 104, and the gate electrode 106 may provide the first capacitance, $C_{FET}$, associated therewith, originating from the more or less conductive regions (the channel region 102 and the gate electrode 106) separated from one another by the gate isolation 104. Regarding the first capacitance, $C_{FET}$, illustratively, the channel region 102 may be considered as a first capacitor electrode, the gate electrode 106 as a second capacitor electrode, and the gate isolation 104 as a dielectric medium disposed between the first and second capacitor electrodes. The first capacitance, $C_{FET}$, of the field-effect transistor 100 may define one or more operating properties of the field-effect transistor 100. The configuration of the field-effect transistor 100 (e.g., of the gate isolation 104) may be adapted according to a desired behavior or application of the field-effect transistor 100 during operation (e.g., according to a desired capacitance), as described in further detail below.

According to various aspects, a memory cell (also referred to as memory cell structure), e.g., FeFET-based memory cell may be provided, for example, by coupling the gate structure 108 of the field-effect transistor 100 with a capacitive memory structure, or by integrating a capacitive memory structure in the gate structure 108 of the field-effect transistor.

Figure 2:
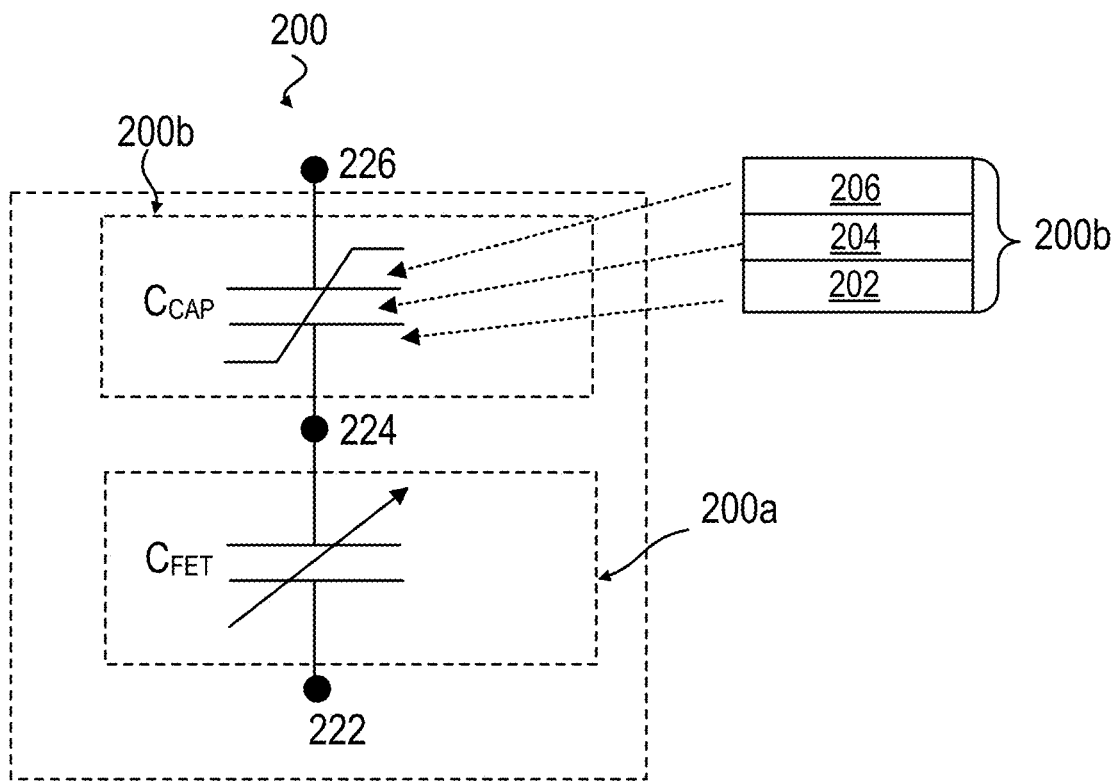
FIG. 2 shows schematically a memory cell, according to various aspects.

FIG. 2 shows a circuit equivalent of a memory cell (or memory cell structure) 200 including a field-effect transistor structure 200a (e.g., configured as described here with reference to the field-effect transistor 100) and a capacitive memory structure 200b, according to various aspects. The field-effect transistor (FET) structure 200a may have a first capacitance, $C_{FET}$, associated therewith and the capacitive memory structure 200b may have a second capacitance, $C_{CAP}$, associated therewith. The field-effect transistor structure 200a and the capacitive memory structure 200b may be coupled (e.g., electrically connected) to one another such that a capacitive voltage divider is provided. The channel or bulk node of the field-effect transistor structure 200a may provide or may be connected to a first node 222 (according to various aspects, provided as or also referred to as terminal 222), an electrode of the capacitive memory structure 200b may provide or may be connected to a second node 226 (according to various aspects, provided as or also referred to as terminal 226) and an intermediate conductive portion (e.g., electrode, layer, etc.) may provide or may be connected to a floating intermediate node 224.

The capacitive voltage divider formed by the field-effect transistor structure 200a and the capacitive memory structure 200b may allow adapting the capacitances $C_{FET}$, $C_{CAP}$ of the respective capacitors to allow an efficient programming of the capacitive memory structure 200b. The overall gate voltage required for switching the memory cell (or memory cell structure) 200 from one memory state into another memory state (e.g., from high threshold voltage state to low threshold voltage state) may become smaller in case the voltage distribution across the field-effect transistor structure 200a and the capacitive memory structure 200b is adapted such that more of the applied gate voltage drops across the functional layer of the capacitive memory structure 200b (e.g., across a remanent-polarizable layer, such as a ferroelectric layer) than across the gate isolation of the field-effect transistor structure 200a. The overall write voltage (illustratively, applied via the nodes 222, 226 to which the field-effect transistor structure 200a and the capacitive memory structure 200b are connected) may thus be reduced by adapting the capacitive voltage divider. The voltage distribution may be determined by voltage divider calculations for a series connection of the capacitors.

The threshold voltage of a field effect transistor structure (e.g., of the field effect transistor structure 200a) may be a function of the amount and/or polarity of charge stored in the capacitive memory structure, e.g. on the polarization state of the memory layer of the capacitive memory structure. A first threshold voltage, e.g. a low threshold voltage VL-th, may be associated with the first polarization state (e.g., with the first amount and/or polarity of stored charge), and a second threshold voltage, e.g. a high threshold voltage VH-th, may be associated with the second polarization state (e.g., with the second amount and/or polarity of stored charge). Illustratively, a first memory state may be associated with the first threshold voltage (e.g., the first memory state may be referred to as low threshold voltage state, or LVT state), and a second memory state may be associated with the second threshold voltage (e.g., the second memory state may be referred to as high threshold voltage state, or as HVT state).

That is, in case the capacitance, $C_{FET}$, of the field-effect transistor structure 200a is adapted (e.g., by providing a suitable gate isolation) a predefined fraction of the voltage applied to the series connection may drop across the capacitive memory structure 200b. Accordingly, the electric field generated across the gate isolation of the field-effect transistor structure 200a underneath the capacitive memory structure 200b could be reduced, if desired. This may lead to a reduced interfacial field stress, which may lead to a reduced wear out of the interface due to, for example, charge injection. Therefore, the reduced electric field generated across the gate isolation may lead to improved endurance characteristics of the memory cell (or memory cell structure) 200, that is, to an increased amount of possible polarization reversals until the memory cell (or memory cell structure) 200 may lose or change its memory properties.

In some aspects, the capacitive memory structure 200b may include a first electrode 202, a second electrode 206, and a function layer (e.g., a memory layer) 204 disposed between the first electrode 202 and the second electrode 206. The functional layer of the capacitive memory structure 200b may be a remanent-polarizable layer. By increasing the capacitance $C_{FET}$ of the field-effect transistor structure 200a (e.g., by providing a gate isolation including a relatively thick layer of material with high dielectric constant), the depolarization field, $E_{Dep}$, of the remanent-polarizable layer may be reduced. The capacitive memory structure 200b is illustrated exemplarily as a planar layer stack, however, it may be understood that the planar configuration shown in FIG. 2 is an example, and other capacitive memory structure designs may include one or more electrodes and/or one or more functional layers with a non-planar shape, for example a trench (also referred to as recess) design.

According to various aspects, a capacitive memory structure 200b having a remanent-polarizable layer (e.g., a layer of a remanently polarizable material, also referred to as ferroelectric material) may be referred to as ferroelectric capacitor and a memory cell or memory cell structure including a ferroelectric capacitor and a field-effect transistor may be referred to as FeFET based memory cell or FeFET based memory structure.

The overall gate voltage required for switching the memory cell 200 from one state into the other (e.g., from high threshold voltage state to low threshold voltage state), i.e. for flipping a ferroelectric dipole from, for example, "up" to "down" or "down" to "up", may become smaller since more of the applied gate voltage drops across at least one remanent-polarizable layer 204 than across the gate isolation structure 104. The voltage distribution may be determined by voltage divider calculations for a series connection of the capacitors $C_{FET}$, $C_{CAP}$. That is, if the capacitance of the second capacitor $C_{CAP}$ is reduced, a greater fraction of the voltage applied to the series connection drops across the second capacitor $C_{CAP}$. That is, if the capacitance of the first capacitor $C_{FET}$ is increased, a greater fraction of the voltage applied to the series connection drops across the second capacitor $C_{CAP}$. Accordingly, the electric field generated across the gate isolation structure 104 reduces because the voltage drop across this structure is reduced. This leads to a reduced interfacial field stress, which may lead to a reduced wear out of the interface due to, for example, charge injection. Therefore, the reduced electric field generated across the gate isolation structure 104 may lead to improved endurance characteristics of the memory cell (or memory cell structure) 200, that is to an increased amount of possible polarization reversals until the memory cell 200 may lose its memory properties.

By reducing the capacitor area of the second capacitor $C_{CAP}$ (e.g., by reducing the lateral extension), the depolarization field, $E_{Dep}$, of the at least one remanent-polarizable layer 204 may be reduced. The depolarization field may be expressed by the following set of equations, wherein the indices "FE" refer to the second capacitor CcAP (also referred to as CFeCap) and the indices "IS" refer to the first capacitor CFET (also referred to as CM1s), as described herein:

$$V_{FE} + V_{IS} = 0,$$

$$D = \varepsilon_0 \varepsilon_{IS} E_{IS} = \varepsilon_0 \varepsilon_{FE} E_{FE} + P,$$

$$E_{FE} = E_{Dep} = -P\left(\varepsilon_0 \varepsilon_{FE}\left(\frac{C_{IS}}{C_{FE}} + 1\right)\right)^{-1}$$

The depolarization field Enep may be detrimental to data retention since it may be dependent on its magnitude that depolarizes the at least one remanent-polarizable layer 204. However, the magnitude may be reduced by increasing the capacitance ratio C1s/CFE (illustratively CFETICcAP). Accordingly, when the area of the second capacitor CcAP is reduced and/or the area of the first capacitor CFET is increased, its overall capacitance is reduced and hence, the depolarization field is reduced. This in turn improves the data retention of the memory cell (or memory cell structure) 200.

According to various aspects, the memory cell 200 may include or may be a capacitive voltage divider of a field-effect transistor (FET) and a ferroelectric capacitor (Fe-CAP), according to various aspects. In order to reduce the write voltage and increase endurance as well as retention of memory cell (or memory cell structure) 200, it may be desirable to adjust the capacitive voltage divider, as described above.

As an example, the memory cell (or memory cell structure) 200 may be illustrated by a series connection of a ferroelectric capacitor (e.g., metal-ferroelectric-metal (MFM) capacitor) and the variable capacitance of the remaining layer stack (e.g., metal-insulator-semiconductor (MIS) layer stack).

In a first approximation, the voltage which drops across the ferroelectric capacitor (VFeCap) may be estimated by:

$$V_{FeCap} = V_{Gate} \cdot \frac{C_{MIS}}{C_{MIS} + C_{FeCap}}$$

wherein $V_{Gate}$ may represent the voltage applied to the gate (e.g., to the second electrode structure 206) and the capacitances in general may be defined as:

$$C = \varepsilon_0 \varepsilon_r \frac{A}{d}$$

with $\varepsilon_0$ and $\varepsilon_r$ being the vacuum and relative permittivity and A and d the area and the thickness of the capacitors respectively.

Assuming that $\varepsilon_r$ may only be modified in a very limited range since it is a material constant and furthermore assuming that variations of the film thicknesses d of the capacitors may be limited (e.g., due to write voltage and leakage current restrictions), a suitable parameter for influencing the voltage drop across the ferroelectric capacitor may be represented by the area of the capacitors and their relative proportion.

As an example, assuming both $\varepsilon_r$ and d may be identical for both of the ferroelectric capacitor and the remaining layer stack, the capacitive voltage drop for an area ratio of 1:3 becomes:

$$V_{FeCap} = V_{Gate} \cdot \frac{C_{MIS}}{C_{MIS} + C_{FeCap}} \stackrel{3 \cdot A_{FeCap} = A_{MIS}}{\cong} V_{Gate} \cdot \frac{3}{4} = 0.75\% \cdot V_{Gate}$$

Accordingly, modifying the area ratio of the capacitors may allow improving the memory cell (or memory cell structure) 200 performance (the write voltage, the endurance, the retention, etc.). The dimensions of the respective capacitors may be defined by their projections of the respective electrodes onto each other. For the ferroelectric capacitor (FeCap) it may be the projection of the top electrode (e.g., the second electrode structure 206) onto the bottom electrode (e.g., the first electrode structure 202), and for the MIS layer stack (CMIS) it may be the projection of the floating gate (e.g., the first electrode structure 106) onto the active area of the device (e.g., the channel region 102) that defines the actual capacitor area.

According to various aspects, a ratio of the capacitor area of the ferroelectric capacitor $C_{CAP}$ to the capacitor area of the MIS layer stack $C_{FET}$ may be selected between 1 and 0, e.g., in the range from about 0.5 to about 0.1, e.g., 0.25 (i.e. 1:4, that is, 4 times larger MIS area than FeCap area).

According to various aspects, a memory cell is provided including a field-effect transistor structure and a capacitive memory structure, wherein the capacitive memory structure is coupled to or integrated in the gate of the field-effect transistor structure, and wherein the field-effect transistor structure is a trench-gate (also referred to as recess-gate) field-effect transistor structure. This allows for various implementations, as examples, the capacity-ratio of the field-effect transistor structure and the capacitive memory structure can be adapted (e.g., selected in a predefined range) by adapting the depth of the trench of the trench-gate field-effect transistor structure (e.g., by selecting a predefined depth).

According to various aspects, in a FeFET (e.g., in a FeFET based memory cell), the write operation changes a spontaneous polarization of a layer including, for example, ferroelectric material. Due the fact that the dielectric displacement field may be constant in the stack, the interfacial region of the layer may be severely stressed by the spontaneous polarization. In order to reduce the effective polarization acting on the interface of the transistor, FeFET device concepts have been introduced in to control the voltage that drops across the FET interface during polarization switching. The issue with some concepts may be that the transistor connected to the FeCAP has to be comparatively large in order to change the voltage divider in favor of the FeCAP, as explained above. Especially for planar transistors, this may lead to a large cell footprint and therefore consumption of silicon area.

According to various aspects, a memory cell is provided that allows for a control of the interfacial field stress based on the device geometry (e.g., based on a CAT-FeFET design, e.g., a FeFET including a channel access transistor, CAT) and consume as little area as possible (e.g., the memory cell may have a possibly low foot-print).

According to various aspects, a Recess-Channel-Access-Transistor (RCAT) is utilized combined with a ferroelectric capacitor to provide a very scalable FeFET based memory cell. The memory cell may be of the channel access transistor (CAT) FeFET type.

In general, an integration of a FeCAP structure into a field-effect transistor structure may be limited in terms of lateral scaling due to the film thickness of the ferroelectric layer. In some aspects, a ferroelectric layer may be incorporated into the recess of a recess-gate field-effect transistor structure; however, in this case, the layer thickness of the ferroelectric layer limits a lateral shrinking of the size of the recess. Therefore, aspects described herein may solve one major shortcoming of conventional RCAT-based FeFET devices, i.e. the limited cell size scalability.

In the following, various examples and aspects of a memory cell (or a memory cell structure) and manufacturing methods are provided.

Figure 3A:
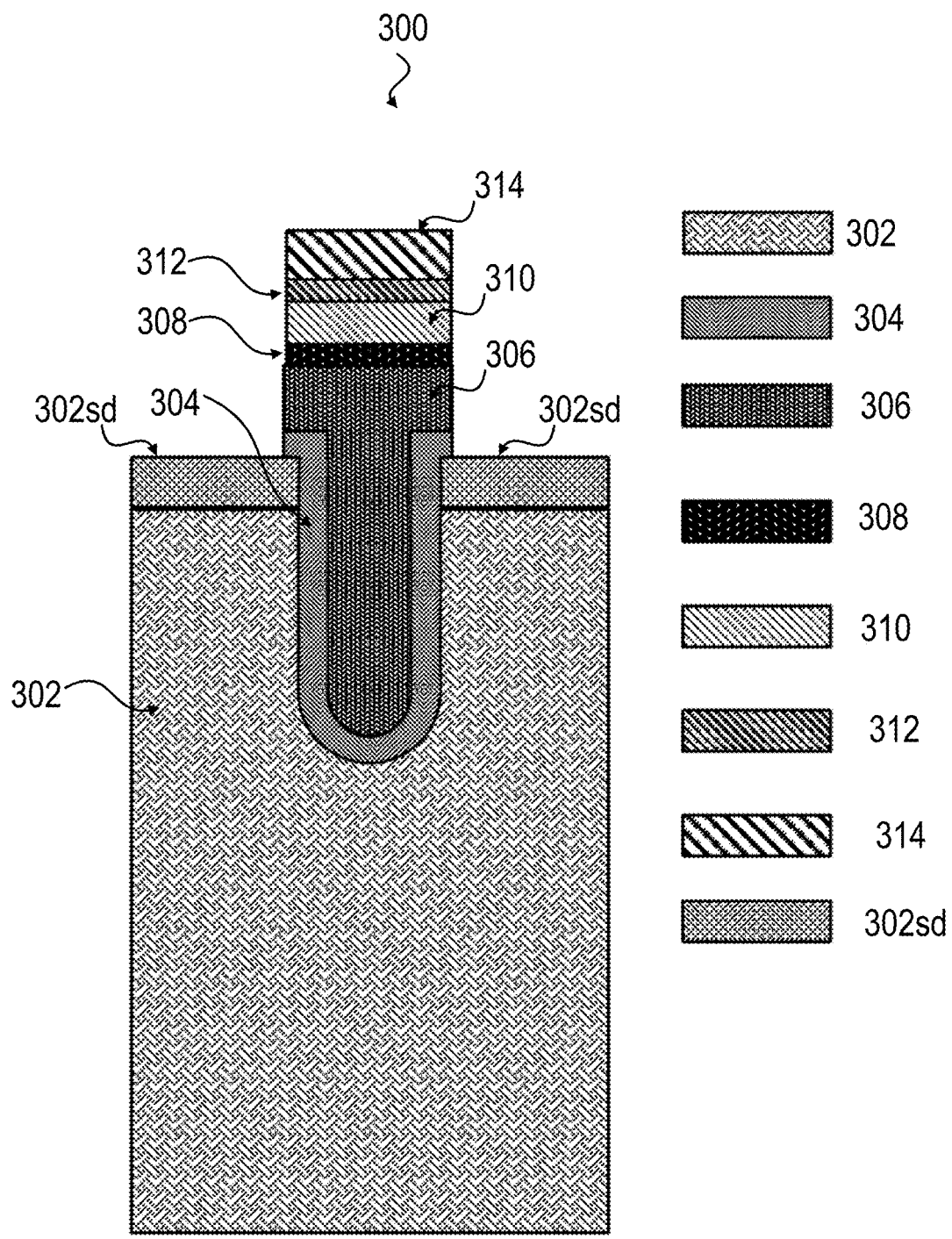

FIG. 3A shows a memory cell 300 (or a memory cell structure 300) in a schematic view, according to various aspects. The memory cell 300 may include a channel region 302, e.g., p-type silicon layer or a layer of any other semiconductor material, e.g., a semiconductor bulk material or a semiconductor layer on a carrier. The memory cell 300 may include a gate isolation 304, e.g., an insulator layer, e.g., a silicon oxide layer or any other electrically insulating material. The gate isolation 304 may include a multilayer structure including one or more different types of dielectric materials, e.g., a high-k and a low-k material, two distinct high-k materials, two distinct low-k materials, as examples. The memory cell 300 may include a floating gate 306. The floating gate 306 may be configured electrically floating. The floating gate 306 may include any suitable electrically conductive material, e.g., a metal, a metal nitride (e.g., TiN), polysilicon, as examples.

According to various aspects, the channel region 302, the gate isolation 304, and the floating gate 306 of the memory cell 300 may be configured to provide a field-effect transistor structure (see or compare the field-effect transistor structure 200a in FIG. 2. The channel region 302 may include source/drain regions 302sd, e.g., including a doped semiconductor material (e.g., n++ doped material in the case that a p-type channel region 302 is used or p++ doped material in the case that an n-type channel region 302 is used). According to various aspects, the gate isolation 304 and the floating gate 306 of the memory cell 300 may form a gate structure of the field-effect transistor structure. According to various aspects, the ate structure of the field-effect transistor structure is configured as a recess-gate structure, wherein the gate isolation 304 and the floating gate 306 are disposed within a recess in the channel region 302. The effective channel 302c that is formed in the channel region 302 along the interface with the gate isolation 304 has a curved and/or angled shape due to the recess design.

According to various aspects, the memory cell 300 may include a first electrode 308 (e.g., a bottom electrode of a capacitive memory structure), a second electrode 312 (e.g., a top electrode of a capacitive memory structure), and a spontaneously polarizable layer 310 (e.g., a layer including a spontaneously polarizable material or consisting of a spontaneously polarizable material). The spontaneously polarizable layer may be ferroelectric layer, e.g., a layer including a ferroelectric material or consisting of a ferroelectric material. The ferroelectric material may be, for example, ferroelectric $HfO_2$.

According to various aspects, the first electrode 308, the second electrode 312, and the spontaneously polarizable layer 310 of the memory cell 300 may be configured to provide a capacitive memory structure (see or compare the capacitive memory structure 200b in FIG. 2. According to various aspects, first electrode 308 and/or the second electrode 312 may include TiN or any other suitable electrically conductive material.

According to various aspects, the memory cell 300 may be controlled by supplying operation voltages to the source/drain regions 302sd of the field-effect transistor structure of the memory cell 300 and to the second electrode 312 of the capacitive memory structure of the memory cell 300. Optionally, the memory cell 300 may include a gate 314 contacting the second electrode 312 of the capacitive memory structure of the memory cell 300 to apply a gate voltage to the memory cell 300.

Figure 3B:
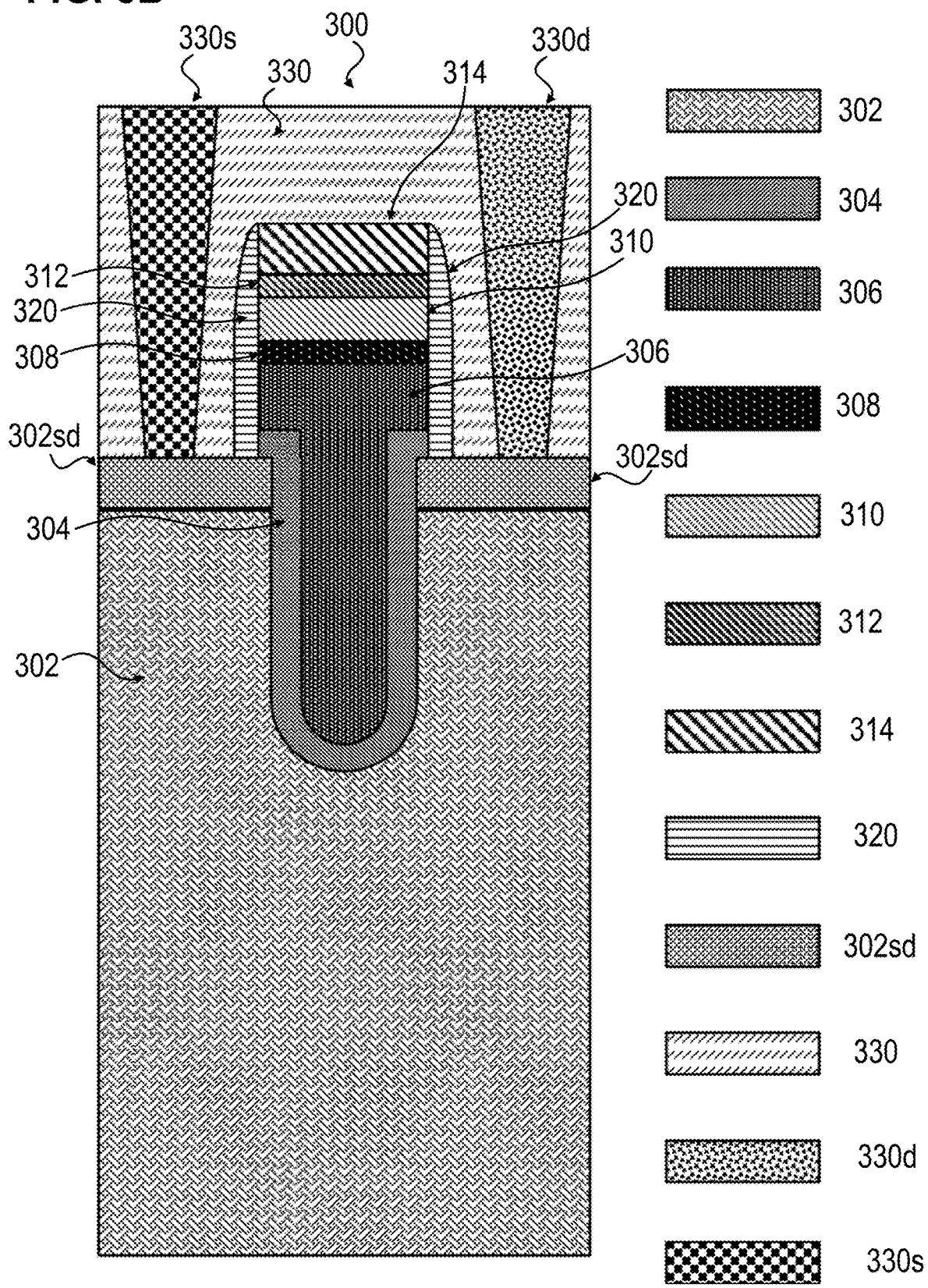

FIG. 3B shows further aspects of the memory cell 300 in a schematic view. In some aspects, the memory cell 300 may further include a spacer structure 320 laterally adjacent to a layer stack formed by a part of the gate isolation 304 (e.g., the part of the gate isolation 304 that extends out of the recess in the channel region 302) a part of the floating gate 306 (e.g., the part of the floating gate 306 that extends out of the recess in the channel region 302), the first electrode 308, the second electrode 312, the spontaneously polarizable layer 310, and optionally the gate 314. The spacer structure 320 may be a sidewall spacer structure contacting the layer stack and the source/drain regions 302sd of the channel region 302.

According to various aspects, in some aspects, the memory cell 300 may further include a contacting structure, as exemplary illustrated in FIG. 3B, including a first source/drain contact 330s (e.g., a source contact 330s contacting a source region 302sd) and a second source/drain contact 330d (e.g., a drain contact 330d contacting a drain region 302sd). The source/drain contacts 330s, 330d may include tungsten or any other suitable electrically conductive material. The contacting structure may further include a dielectric portion 330 in which the source/drain contacts 330s, 330d may be completely or partially embedded. The dielectric portion 330 may include silicon nitride or any other suitable electrically insulating material, e.g., a low-k or ultra-low-k material.

FIG. 3C shows further aspects of the memory cell 300 in a schematic view. In some aspects, the memory cell 300 may include a well 302w (e.g., a well implantation in the channel region 302, e.g., a well implantation from in a semiconductor bulk region 302). In some aspects, the memory cell 300 may include a deep well 302dw (e.g., a deep well implantation in the channel region 302, e.g., a deep well implantation from in a semiconductor bulk region 302). The well 302w may include doped semiconductor material, (e.g., p+ doped material to implement a p-type channel or n+ doped material to implement an n-type channel). The deep well 302*dw* may include doped semiconductor material of the opposite doping type with respect to the well 302*w*, (e.g., n+ doped material to implement a p-type channel in a p-well or n+ doped material to implement an n-type channel in an n-well).

FIG. 4A and FIG. 4B show further aspects of the memory cell 300, e.g., a memory cell 400*a* and a memory cell 400*b*, wherein, according to various aspects, the floating gate 306 of the memory cell 400*a*, 400*b* is disposed completely within the recess within the channel region 302. In some aspects, the first electrode 308 may be partially (see FIG. 4A) or completely (see FIG. 4B) disposed within the recess in the channel region 302. However, according to various aspects the spontaneously polarizable layer 310 may not be disposed within the recess in the channel region 302 to allow for a low lateral extension of the recess and therefore a low foot-print associated with the memory cell 300, 400*a*, 400*b*.

According to various aspects, the gate isolation 304 may be indirect physical contact with the spontaneously polarizable layer 310, see, for example, FIG. 4A and FIG. 4B.

According to various aspects, a memory cell arrangement may include a plurality of memory cells 300, 400*a*, 400*b*, wherein one or more shallow trench isolations (STI) are implemented to separate one or more memory cells from one another. In some aspects, the one or more shallow trench isolations may reach down at least to the deep well 302*dw*. This may allow for providing a well 302*w* for a corresponding set of memory cells 300, 400*a*, 400*b* (e.g., memory cells 300, 400*a*, 400*b* that share the same bit-line connected to the drain regions 302*sd* and drain contacts 330*d* of respective memory cells 300, 400*a*, 400*b*). In other words, each of the bit-lines has a corresponding well 302*w* associated therewith and two neighboring wells are separated by one or more shallow trench isolations. This allows for an efficient writing (e.g., programming and/or erasing) of the respective memory cells 300, 400*a*, 400*b*.

Figure 5A:
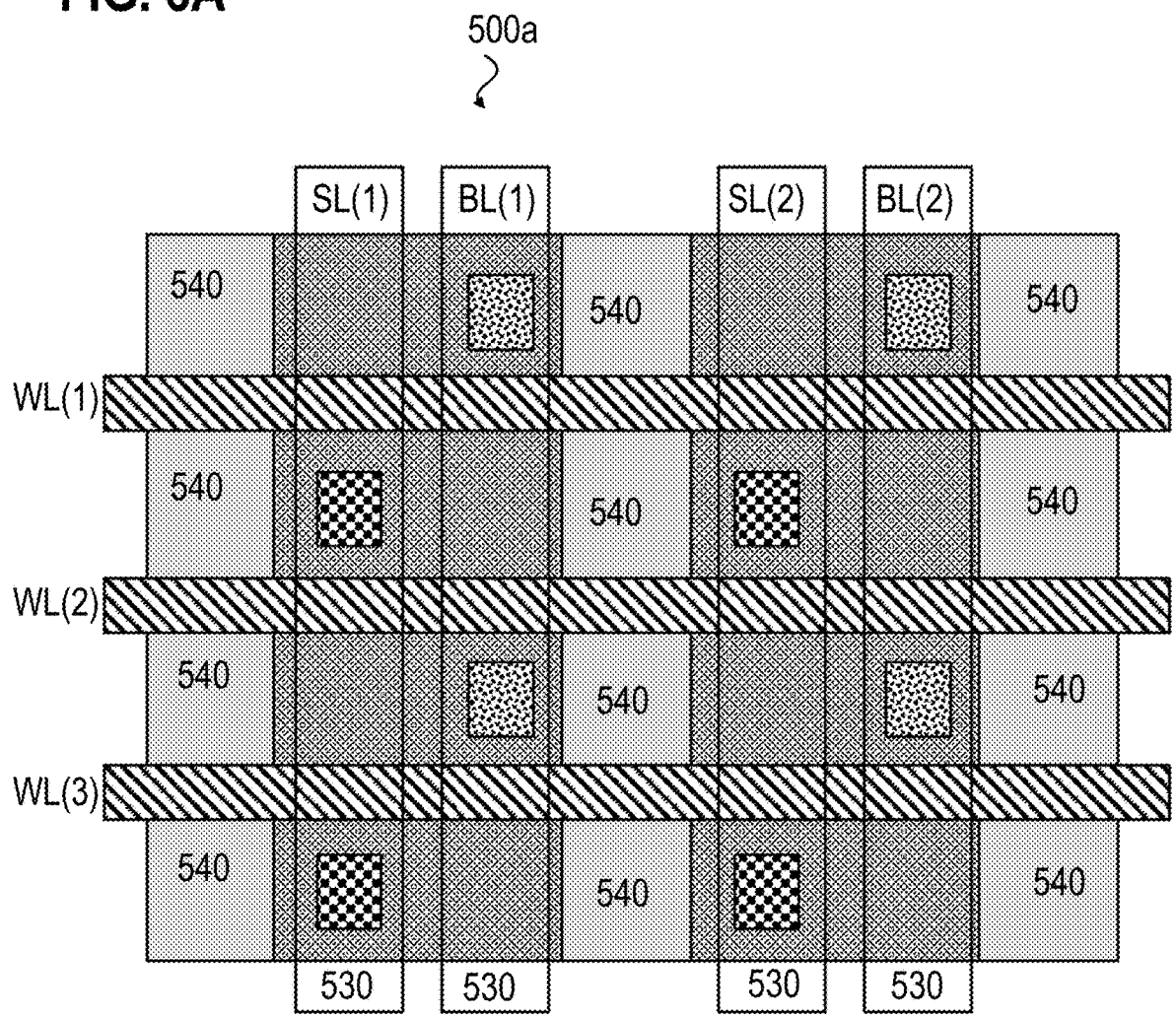
FIG. 5A and FIG. 5B show schematically various aspects of a memory cell arrangements including a plurality of memory cells.
Figure 5B:
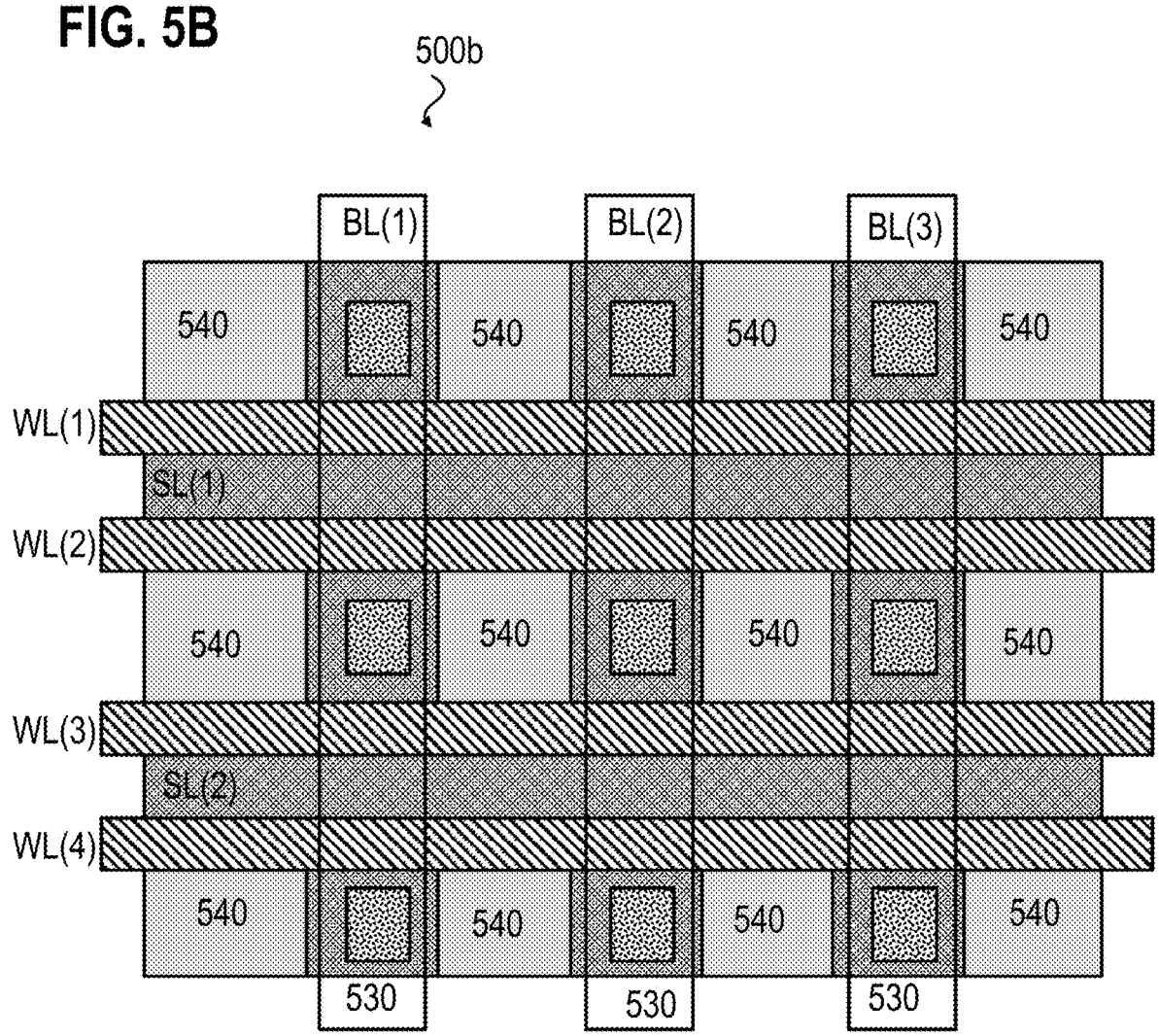

FIG. 5A and FIG. 5B show further aspects of the memory cell 300, e.g., (in a top view) layouts of memory cell arrangements 500*a*, 500*b* each including a plurality of memory cells.

According to various aspects, a plurality of memory cells may be arranged in an AND-type arrangement 500*a*, as illustrated for six memory cells in FIG. 5A. The source contacts 330*s* of various sets of memory cells are connected via a corresponding shared source-line SL(1, 2) and the drain contacts 330*d* of various sets of memory cells are connected via a corresponding shared bit-line BL(1, 2). The gates 314 of other sets of memory cells provide a corresponding word-line WL(1, 2, 3). The control lines (e.g., the source-lines and the bit-lines may include a metal 530 or may be metal lines. Various neighboring memory cells or various groups of neighboring memory cells are separated from one another by one or more shallow trench isolations 540.

According to various aspects, a plurality of memory cells may be arranged in an NOR-type arrangement 500*b*, as illustrated for twelve memory cells in FIG. 5B. The source contacts 330*s* of various sets of memory cells are connected via a corresponding shared diffused source-line SL(1, 2) and the drain contacts 330*d* of various sets of memory cells are connected via a corresponding shared bit-line BL(1, 2, 3). The gates 314 of other sets of memory cells provide a corresponding word-line WL(1, 2, 3, 4). The bit-lines may include a metal 530 or may be metal lines. Various neighboring memory cells or various groups of neighboring memory cells are separated from one another by one or more shallow trench isolations 540.

The NOR-type arrangement 500*b* may be configured as a virtual ground NOR-type arrangement 500*b* which may allow for a use of a lowest possible number of contacts to operate the memory cells of the NOR-type arrangement 500*b*.

Figure 6:
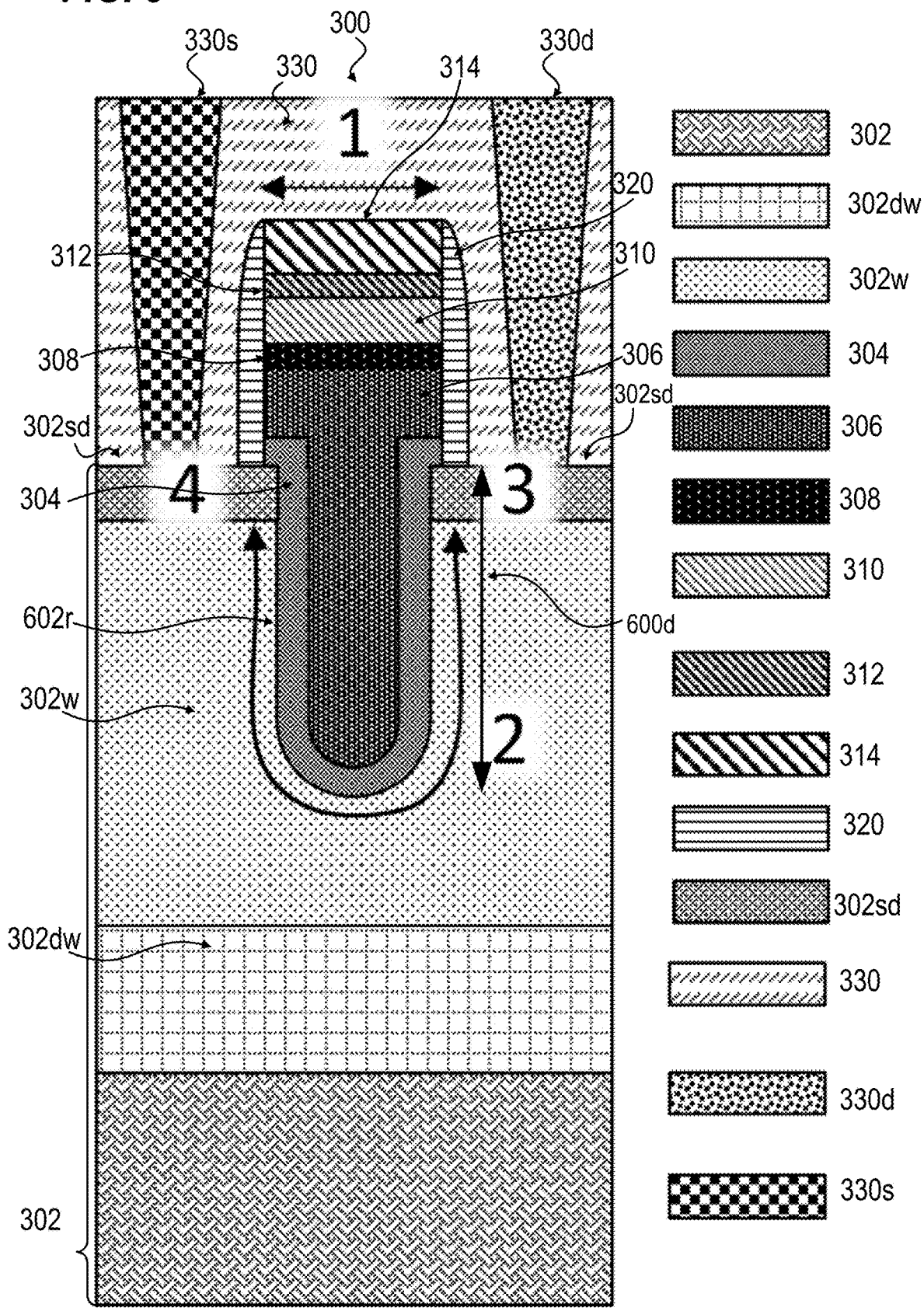
FIG. 6 shows schematically various aspects of a functioning of a memory cell.

FIG. 6 shows various aspects of a functioning of the memory cell 300 (similarly of the memory cells 400*a*, 400*b*), according to various aspects. The effective area of the FeCAP can be defined by the dimension indicated as (1), e.g., a lateral dimension, e.g., a lateral area. The effective area of the underlying FET (which is of a recess type) may be defined by the dimension indicated as (2), e.g., a length of an interface between the channel region 302, 302*w* and the gate isolation 304 (see FIGS. 3A to 3C), e.g., an area of an interface between the channel region 302, 302*w* and the gate isolation 304 that is active for the memory cell 300. This way a capacitance ratio ($C_{FeCAP}/C_{FET}$) of larger than e.g., 1 can be achieved due to a configuration in which the effective FET channel (2) is longer than the lateral dimension (1).

According to various aspects, a capacitance ratio can be modified by modifying the depth 600*d* of the recess 602*r* in the channel region 302, 302*w*.

According to various aspects, a read out operation may be carried out as usual by analyzing a drain (3) to source (4) current flow.

According to various aspects, one or more process-parts may be used for manufacturing a memory cell 300, 400*a*, 400*b* and/or a memory cell arrangement 500*a*, 500*b*, as described herein, or any other, e.g., similar, memory cell or memory cell arrangement.

According to various aspects, a method for manufacturing one or more memory cells may include one or more or all of the following sub-processes:
  forming one or more shallow trench isolations;
  etching one or more recesses into semiconductor material (e.g., a semiconductor bulk material or a semiconductor layer);
  doping one or more regions of the semiconductor material, e.g., by implantation;
  an optional implantation, e.g., for $V_T$ control;
  partially filling the one or more recesses with insulator material (e.g., forming a gate isolation within each of the one or more recesses);
  filling a remaining space within the one or more recesses with an electrically conductive material (e.g., forming a floating gate within each of the one or more recesses, the floating gate may or may not extend out of the respective recess);
  partially removing material of the floating gate and/or the gate isolation, e.g., by planarization (e.g., by chemical mechanical polishing CMP).
The semiconductor material, the gate isolation, and the floating gate may form a respective field-effect transistor structure of one or more memory cells.

According to various aspects, a method for manufacturing one or more memory cells may further include one or more or all of the following sub-processes:
  forming (e.g., depositing) a first (e.g., bottom) electrode;
  pattering the floating gate (e.g., including, for example, hard mask deposition, lithography, etch, spacer/liner deposition, etch, as examples);
  forming (e.g., depositing) a spontaneously polarizable material over the first (e.g., bottom) electrode; and forming (e.g., depositing) a second (e.g., top) electrode over the spontaneously polarizable material.

The first (e.g., bottom) electrode, the spontaneously polarizable material, and the second (e.g., top) electrode may form a respective capacitive memory structure of one or more memory cells.

According to various aspects, the method for manufacturing one or more memory cells may further include one or more or all of the following sub-processes:

forming (e.g., depositing) a gate material over the second (e.g., top) electrode;

patterning the gate stack (e.g., at least patterning the first (e.g., bottom) electrode, the spontaneously polarizable material, the second (e.g., top) electrode), including, for example, hard mask deposition, lithography, etch, spacer/liner deposition, etch as examples;

spacer deposition and recess;

implantation;

forming (e.g., depositing) a dielectric;

planarizing the dielectric (e.g., by CMP);

forming one or more contact holes within the dielectric (including, for example, hard mask deposition, lithography, etch, as examples);

contact formation (including, for example, barrier deposition, seed deposition, as examples);

planarizing the contact structure (e.g., by CMP).

According to various aspects, the method for manufacturing one or more memory cells may further include one or more subsequent processes for finishing processing.

In the following, various examples are provided that may refer to one or more aspects described above and/or illustrated in the figures.

Example 1 is a memory cell including: a semiconductor layer; a recess (also referred to as a trench) disposed in the semiconductor layer; a first source/drain region and a second source/drain region disposed in the semiconductor layer adjacent to the recess; a floating gate disposed at least partially in the recess and a gate isolation disposed at least partially in the recess between the floating gate and the semiconductor layer; a first electrode disposed over the floating gate and in electrical contact with the floating gate; a spontaneously polarizable layer disposed over the first electrode and a second electrode disposed over the spontaneously polarizable layer.

In Example 2, the memory cell of Example 1 may optionally further include that the spontaneously polarizable layer, the first electrode, and the second electrode form a capacitive memory structure of the memory cell; and that the semiconductor layer, the first source/drain region, the second source/drain region, the floating gate, and the gate isolation form a field-effect transistor structure of the memory cell.

In Example 3, the memory cell of Example 2 may optionally further include that the memory cell is configured such that a change of a polarization state of the spontaneously polarizable layer modifies a threshold value of the field-effect transistor structure of the memory cell.

In Example 4, the memory cell of any one of Examples 1 to 3 may optionally further include that the spontaneously polarizable layer has a planar shape.

In Example 5, the memory cell of any one of Examples 1 to 4 may optionally further include that the spontaneously polarizable layer is disposed completely outside the recess.

In Example 6, the memory cell of any one of Examples 1 to 5 may optionally further include that the recess is free of a memory layer (e.g., free of a spontaneously polarizable material) defining a memory state of the memory cell.

In Example 7, the memory cell of any one of Examples 1 to 6 may optionally further include that a lateral dimension of the recess is less than a lateral dimension of the first electrode.

In Example 8, the memory cell of any one of Examples 1 to 7 may optionally further include that a lateral dimension of the recess is less than a lateral dimension of the second electrode.

In Example 9, the memory cell of any one of Examples 1 to 8 may optionally further include that a lateral dimension of the recess is less than a lateral dimension of the spontaneously polarizable layer.

In Example 10, the memory cell of any one of Examples 1 to 9 may optionally further include that the spontaneously polarizable layer is in direct physical contact with the first electrode.

In Example 11, the memory cell of any one of Examples 1 to 10 may optionally further include that the spontaneously polarizable layer is in direct physical contact with the second electrode.

In Example 12, the memory cell of any one of Examples 1 to 11 may optionally further include that the spontaneously polarizable layer includes one or more sublayers of a remanent-polarizable material.

In Example 13, the memory cell of any one of Examples 1 to 12 may optionally further include that the spontaneously polarizable layer includes at least one sublayer of a remanent-polarizable material and at least one additional dielectric layer.

In Example 14, the memory cell of any one of Examples 1 to 13 may optionally further include that the spontaneously polarizable layer, the first electrode, and the second electrode form a capacitive memory structure of the memory cell; and that the semiconductor layer, the first source/drain region, the second source/drain region, the floating gate, and the gate isolation form a field-effect transistor structure of the memory cell; and that the capacitive memory structure and the field-effect transistor structure are arranged in a capacitive voltage divider configuration.

In Example 15, the memory cell of any one of Examples 1 to 14 may optionally further include that a capacitance ratio of the capacitive voltage divider configuration is defined by a depth of the recess.

In Example 16, the memory cell of any one of Examples 1 to 15 may optionally further include that the semiconductor layer includes a well region, and wherein the recess is formed in the well region.

In Example 17, the memory cell of any one of Examples 1 to 15 may optionally further include that the semiconductor layer includes a well region and a deep well region, wherein the well region is disposed between the first and second source/drain regions and the deep well region, and wherein the recess is formed in the well region, wherein a portion of the well region separates the gate isolation disposed in the recess from the deep well region.

In Example 18, the memory cell of Example 17 may optionally further include: an isolation structure disposed in the semiconductor layer, wherein the isolation structure extends through the well region to the deep well region.

In Example 19, the memory cell of Example 18 may optionally further include that the isolation structure is a shallow trench isolation.

In Example 20, the memory cell of any one of Examples 1 to 19 may optionally further include that the gate isolation consist of a layer of a dielectric material.

In Example 21, the memory cell of any one of Examples 1 to 19 may optionally further include that the gate isolation includes a first layer of a first dielectric material and a second layer of a second dielectric material, wherein the first dielectric material is distinct from the second dielectric material.

In Example 22, the memory cell of Example 21 may optionally further include that the first dielectric material has a first dielectric constant and that the second dielectric material has a second dielectric constant different from the first dielectric constant. According to various aspects, the first dielectric constant may be less than 4 and the second dielectric constant may be greater than 4.

In Example 23, the memory cell of any one of Examples 1 to 22 may optionally further include that the first electrode is in direct physical contact with the floating gate.

In Example 24, the memory cell of any one of Examples 1 to 23 may optionally further include that the first electrode is in direct physical contact with the gate isolation.

In Example 25, the memory cell of any one of Examples 1 to 24 may optionally further include that the spontaneously polarizable layer is in direct physical contact with the gate isolation.

In Example 26, the memory cell of any one of Examples 1 to 25 may optionally further include that the spontaneously polarizable layer has the same lateral dimension as the second electrode.

In Example 27, the memory cell of any one of Examples 1 to 26 may optionally further include that the spontaneously polarizable layer has the same lateral dimension as the first electrode or at least as a portion of the first electrode.

In Example 28, the memory cell of any one of Examples 1 to 26 may optionally further include that the spontaneously polarizable layer has a lateral dimension that is greater than a lateral dimension of the first electrode.

In Example 29, the memory cell of any one of Examples 1 to 28 may optionally further include that the spontaneously polarizable layer has a lateral dimension that is greater than a lateral dimension of the floating gate.

In Example 30, the memory cell of any one of Examples 1 to 29 may optionally further include that the spontaneously polarizable layer has a first lateral dimension in a first region thereof and a second lateral dimension different from the first lateral dimension in a second region thereof.

In Example 31, the memory cell of any one of Examples 1 to 30 may optionally further include that the gate isolation has a curved and/or angled shape.

In Example 32, the memory cell of any one of Examples 1 to 31 may optionally further include that at least a part of the gate isolation extends from a surface of the semiconductor layer into the semiconductor layer; and that the spontaneously polarizable layer is disposed over the surface of the semiconductor layer.

Example 33 is a memory cell including: a field-effect transistor structure, the field-effect transistor structure including a gate structure to control a current flow in a channel, the gate structure including a gate isolation and a floating gate, wherein at least a part of the gate structure extends from a surface of a semiconductor layer into the semiconductor layer; and a capacitive memory structure, the capacitive memory structure including at least two electrodes and a spontaneously polarizable layer disposed between the at least two electrodes, wherein one of the at least two electrodes is in direct physical contact with the floating gate of the field-effect transistor structure, and wherein the spontaneously polarizable layer is disposed over the surface of the semiconductor layer.

Example 34 is a memory cell including: a field-effect transistor structure, the field-effect transistor structure including a gate structure to control a current flow in a channel, the gate structure including a gate isolation and a floating gate, wherein at least a part of the gate structure extends from a surface of a semiconductor layer into the semiconductor layer; and a capacitive memory structure, the capacitive memory structure including at least two electrodes and a spontaneously polarizable layer disposed between the at least two electrodes, wherein one of the at least two electrodes is in direct physical contact with the floating gate of the field-effect transistor structure, and wherein the capacitive memory structure is disposed over the surface of the semiconductor layer.

Example 35 is a memory cell arrangement including: a plurality of memory cells according to any one of claims 1 to 20 arranged in an AND configuration.

Example 36 is a memory cell arrangement including: a plurality of memory cells according to any one of claims 1 to 20 arranged in a NOR configuration.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "coupled" may be used herein with respect to nodes, terminals, integrated circuit elements, and the like, to mean electrically connected, e.g., electrically conductively connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "over", used herein to describe forming a feature, e.g., a layer "over" a side or surface, may be used to mean that the feature, e.g., the layer, may be formed "directly on", e.g., in direct contact with, the implied side or surface. The word "over", used herein to describe forming a feature, e.g., a layer "over" a side or surface, may be used to mean that the feature, e.g., the layer, may be formed "indirectly on" the implied side or surface with one or more additional layers being arranged between the implied side or surface and the formed layer.

In like manner, the term "cover", used herein to describe a feature disposed over another, e.g., a layer "covering" a side or surface, may be used to mean that the feature, e.g., the layer, may be disposed over, and in direct contact with, the implied side or surface. The word "cover", used herein to describe a feature disposed over another, e.g., a layer "covering" a side or surface, may be used to mean that the feature, e.g., the layer, may be disposed over, and in indirect contact with, the implied side or surface with one or more additional layers being arranged between the implied side or surface and the covering layer.

The term "lateral" used with regards to the "lateral" extension of a structure, a portion, a structure element, a layer, etc., provided, for example, over and/or in a carrier (e.g., a layer, a substrate, a wafer, etc.) or "laterally" next to, may be used herein to mean an extension or a positional relationship along a surface of the carrier. That means that a surface of a carrier (e.g., a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral extension of a structure. Further, the term "height" used with regards to a height of a structure, a portion, a structure element, a layer, etc., may be used herein to mean an extension of a structure along a direction perpendicular to the surface of a carrier (e.g., perpendicular to the main processing surface of a carrier). The term "thickness" used with regards to a "thickness" of a layer may be used herein to mean the spatial extension of the layer perpendicular to the surface of the support (the material or material structure) on which the layer is deposited. If a surface of the support is parallel to the surface of the carrier (e.g., parallel to the main processing surface) the "thickness" of the layer deposited on the surface of the support may be the same as the height of the layer.

The term "conform" or "conformally" used with regards to a layer (e.g., a spacer layer, a liner layer, etc.) may be used herein to mean that the layer may have substantially the same thickness along an interface with another structure, e.g., the shape of a surface of a conformal layer may be substantially the same as the shape as of a surface of the underlying structure on which the layer is formed. According to various aspects, layering processes such as plating or several chemical vapor processes (CVD), e.g., low pressure (LP)-(CVD), atomic layer deposition (ALD), etc., may be used to generate a conformal layer of a material. A conformal deposition process may allow covering sidewalls completely, e.g., even if the sidewall is aligned vertical to the surface of the carrier and/or parallel to the deposition direction. A sidewall may be, for example, generated by an opening (as for example a trench, a recess, a through hole, etc.) or by a structure element (as for example a fin, a protrusion, etc.).

The term region used with regards to a "doped region", "source region", "body region", "drain region", "channel region", "contact region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.) with only one doping type.

According to various aspects, a semiconductor portion may be made of or may include silicon. However, other semiconductor materials of various types may be used in a similar way, e.g., germanium, Group III to V (e.g., SiC), or other types, including for example carbon nanotubes, organic materials (e.g., organic polymers), etc. In an embodiment, the semiconductor portion is a wafer made of silicon (e.g., p-type doped or n-type doped). In an alternative embodiment, the semiconductor portion is a silicon on insulator (SOI) wafer. In an alternative embodiment, the semiconductor portion may be provided by a semiconductor structure, e.g., by one or more semiconductor fins, one or more semiconductor tubes, one or more semiconductor nanosheets, one or more semiconductor nanowires, etc., disposed at a carrier.

Further, another memory technology may be based on a ferroelectric field-effect transistor (FeFET). In this case, a memory cell may include a field-effect transistor (FET) having a ferroelectric material as a gate insulator. Since a ferroelectric material has two stable polarization states, it may be used to shift the threshold voltage of the field-effect transistor in a nonvolatile fashion; and, therefore, to turn the field-effect transistor, that usually loses its logic state, when power is removed, into a nonvolatile field-effect transistor that stores its state in a nonvolatile fashion, when power is removed.

In comparison to other emerging memory technologies, the FeFET memory cell may be in general integrated in the Front-End-of-Line (FEoL) and not in the Back-End-of-Line (BEoL) process flow, since it is a transistor-type of memory. Accordingly, the integration of the FeFET memory cell may comply with the standard FEoL complementary metal-oxide-semiconductor (CMOS) process flow. Consequently, various different integration schemes may be used for different process technologies, e.g., gate-first technologies, gate-last technologies, fully-depleted silicon-on-insulator (FDSOI) technologies, Fin-FET technologies, nanosheet technologies, nanowire technologies, etc. Those different process technologies may be, for example, relevant for technology nodes with a feature size equal to or less than 45 nm.

FeFET memory cells may be implemented into other process technologies, wherein different integration schemes may be used. The FeFET memory cells may be integrated, for example, next to one or more logic circuit structures, e.g., next to one or more processor cores on a chip. However, the FeFET memory cells may be integrated independently from other structures.

According to various aspects, various designs and integration schemes for a memory cell are provided. At least some of the designs and integration schemes may be exemplarily illustrated and described for specific technology. However, the designs and integration schemes described herein may be used in the same or in a similar way for any other suitable process technology.

Various designs and integration schemes for a memory cell are described herein. The memory cell may be formed by suitable processes (usually layering, patterning, doping, thermal treatment, etc.) used in or compatible with semiconductor processing. According to various aspects, atomic layer deposition (ALD) may be used as a layering process. According to various aspects, atomic layer etching (ALE) and/or reactive ion etching (RIE) may be used in a patterning process, e.g., to partially or completely remove one or more layers, etc.

According to various aspects, an electrode structure (e.g., one or more electrode structures of a memory cell, a gate electrode structure, etc.) may include an electrode material, which may be a conductor or a highly conducting (e.g., degenerately doped) semiconductor. The electrode structure may include for example at least one material of the following group of materials: titanium nitride (TiN), tantalum nitride (TaN), carbon (C), tungsten (W), platinum (Pt), copper (Cu), aluminum (Al), ruthenium (Ru), ruthenium oxide ($RuO_2$), iridium (Ir), iridium oxide ($IrO_2$), etc. However, any other suitable material may be used to form an electrode structure (e.g., one or more electrode layers, etc.). According to various aspects, the electrode structure may be adapted (e.g., considering a chemical and/or mechanical stability) for transition metal oxide and/or transition metal nitride (e.g., $HfO_2$ based materials, such as ferroelectric (FE) $HfO_2$), e.g., $ZrO_2$ based materials, e.g., scandium nitride based materials) as an adjacent insulating material.

According to various aspects, one or more contact structures (also referred to as contacts) may be used to electrically contact a semiconductor portion, an electrode structure, etc. In this case, any electrically conductive (e.g., metallic) material may be used that is suitable for forming an electrical contact. As an example tungsten (W), cobalt (Co), etc. may be used.

According to various aspects, a gate structure (e.g., including a gate isolation and a gate electrode) may be used as part of a field-effect transistor. A gate may be a main terminal of a field-effect transistor, e.g., in MOS technology. The material used to form the gate electrode may include, for example, highly doped polysilicon, aluminum, etc. However, any other suitable electrically conductive material may be used.

According to various aspects, a high-k material may be used, e.g., within the gate isolation. A high-k (HK) material may include, for example, hafnium oxide ($HfO_2$), zirconium oxide ($ZrO_2$), lanthanum oxide ($La_2O_3$) and their doped/modified variants (e.g., doped with silicon) or any suitable insulator material that has a relative permittivity at least as high as silicon dioxide. According to various aspects, the high-k material may also be replaced by a sacrificial layer (SL) or a combination of high-k material and sacrificial layer. Such an etch stop layer may include, for example, TiN, TaN, or any other material that is stable in contact to its interfacing materials and has a substantial selectivity to the material subject to etching (e.g., poly-silicon).

According to various aspects, an electrical insulator may be or may include any suitable type of electrically non-conductive material or a material that has a substantially lower conductivity as compared to a metal. As an example, silicon nitride (SiN), silicon oxide ($SiO_2$), etc., may be used. According to various aspects, a ferroelectric material is considered electrically insulating. An electrical insulator may be, in some aspects, also referred to as a dielectric material.

According to various aspects, one or more patterning processes may be used to form a field-effect transistor structure and/or a memory structure, e.g., at least one of over or in a carrier. Therefore, a mask may be used. A mask may include a material that serves for transferring a photo-lithography mask pattern into one or more material layers. A mask may include, for example, a positive or negative photo resist (also referred to as soft mask) or a hard mask. The photo resist itself may be patterned by standard lithography processes. The patterning of the hard mask material may include a combination of photo resist patterning followed by etch of the hard mask material (e.g., wet or dry chemical etching). However, any other suitable process may be used to transfer a desired pattern into one or more material layers.

According to various aspects, a metal-ferroelectric-metal-insulator-semiconductor (MFMIS) FeFET may be provided. In this case, a floating gate, i.e. a metal layer, may be disposed between the ferroelectric material and the gate isolation. In this case, the gate of the transistor may be connected in series to a ferroelectric capacitor.

According to various aspects, (e.g., highly) doped silicon may be used. In this case, donor (e.g., phosphorous) and/or acceptor (e.g., boron) doping may be used for doping the silicon. Silicon may be used in a single crystalline or polycrystalline microstructure.

According to various aspects, at least one spacer (also referred to as sidewall spacer or spacer structure) may be used. In this case, a (e.g., electrically insulating) material may be utilized for covering and/or protecting one or more sidewalls of certain structures (e.g., of a gate structure, a memory structure, etc.). The material may be for example silicon nitride (SiN), silicon oxide ($SiO_2$), etc. However, any other material may be used that allows a conformal deposition for providing the spacer.

According to various aspects, a shallow trench isolation (STI) may be used to separate adjacent field-effect transistor structures and/or to separate a memory cell from an adjacent field-effect transistor structure.

According to various aspects, a spontaneously polarizable (e.g., ferroelectric or anti-ferroelectric) material may be used as part of a memory structure in a memory cell. The memory structure may be a capacitive memory structure including at least two electrodes and the spontaneously polarizable material disposed between the at least two electrodes.

According to various aspects, a ferroelectric material may be used as part of a capacitive memory structure of a memory cell. A ferroelectric material may be an example of material of a memory layer. Illustratively, ferroelectric materials may be used to store data in non volatile manner in integrated circuits. The term "ferroelectric" may be used herein, for example, to describe a material that shows a hysteretic charge voltage relationship (Q V). Doped or substituted hafnium oxide ($HfO_2$), doped or substituted zirconium oxide ($ZrO_2$) or, more in general, transition-metal-oxides (TMO) and their mixtures may show great remanent polarization under certain process conditions (e.g., $Hf_{0.5}Zr_{0.5}O_2$ may possess strong ferroelectric properties). However, the choice of material for a memory layer is not limited to ferroelectric materials. Electrical properties and, more specifically, polarization properties of a TMO may depend its stoichiometry and/or sub-stoichiometry. In some aspects, a presence of defects in the material may influence one or more electrical properties (e.g., polarization properties) of a spontaneously polarizable material. Such defects may include ionic defects (oxygen vacancies (VO), as an example), electronic defects, defect dipoles, and/or domain boundaries, as examples.

Materials

The material of a memory layer may be or may include at least one of the following: a doped transition metal oxide, an undoped transition metal oxide, a doped transition metal nitride, an undoped transition metal nitride, a doped metal nitride (e.g., aluminum nitride), and/or an undoped metal nitride. As an example, the material of a memory layer may be or may include hafnium oxide (ferroelectric hafnium oxide, $HfO_2$), zirconium oxide (ferroelectric zirconium oxide, $ZrO_2$), and/or a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. The ferroelectric material may be doped at a concentration from about 2 mol % to about 6 mol %, only as an example. As another example, the material of a memory layer may be or may include scandium nitride.

Anti ferroelectric properties may be provided, for example, by doping a transition metal oxide with silicon and/or aluminum, e.g. to obtain anti ferroelectric properties of hafnium oxide or hafnium zirconium oxide. For example, in the case of anti ferroelectric properties of the spontaneous polarizable memory layer, the hafnium oxide, $HfO_2$, may be doped with silicon, $Si:HfO_2$, in the range from about 5 cat % to about 12 cat % of silicon. As another example, in the case of anti ferroelectric properties of the spontaneous polarizable memory layer, the hafnium oxide, $HfO_2$, may be doped with aluminum, $Al:HfO_2$, in the range from about 5 cat % to about 12 cat % of aluminum.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell comprising:
a semiconductor layer;
a recess disposed in the semiconductor layer;
a first source/drain region and a second source/drain region disposed in the semiconductor layer adjacent to the recess;
a floating gate disposed fully in the recess and a gate isolation disposed at least partially in the recess between the floating gate and the semiconductor layer;
a first electrode disposed over the floating gate and in electrical contact with the floating gate; wherein the first electrode is at least partially disposed in the recess;
a spontaneously polarizable layer disposed over the first electrode and a second electrode disposed over the spontaneously polarizable layer.

2. The memory cell of claim 1,
wherein the spontaneously polarizable layer, the first electrode, and the second electrode form a capacitive memory structure of the memory cell; and
wherein the semiconductor layer, the first source/drain region, the second source/drain region, the floating gate, and the gate isolation form a field-effect transistor structure of the memory cell.

3. The memory cell of claim 2,
wherein the memory cell is configured such that a change of a polarization state of the spontaneously polarizable layer modifies a threshold value of the field-effect transistor structure of the memory cell.

4. The memory cell of claim 1,
wherein the spontaneously polarizable layer has a planar shape; and
wherein the gate isolation has a curved and/or angled shape.

5. The memory cell of claim 1,
wherein the spontaneously polarizable layer is disposed outside the recess.

6. The memory cell of claim 1,
wherein a lateral dimension of the recess is the same as a lateral dimension of the first electrode.

7. The memory cell of claim 1,
wherein a lateral dimension of the recess is less than a lateral dimension of the second electrode; and wherein a lateral dimension of the recess is less than a lateral dimension of the spontaneously polarizable layer.

8. The memory cell of claim 1,
wherein the spontaneously polarizable layer is in direct physical contact with the first electrode and the second electrode.

9. The memory cell of claim 1,
wherein the spontaneously polarizable layer comprises one or more sublayers of a remanent-polarizable material; or
wherein the spontaneously polarizable layer comprises at least one sublayer of a remanent-polarizable material and at least one additional dielectric layer.

10. The memory cell of claim 1,
wherein the spontaneously polarizable layer, the first electrode, and the second electrode form a capacitive memory structure of the memory cell; and
wherein the semiconductor layer, the first source/drain region, the second source/drain region, the floating gate, and the gate isolation form a field-effect transistor structure of the memory cell; and
wherein the capacitive memory structure and the field-effect transistor structure are arranged in a capacitive voltage divider configuration.

11. The memory cell of claim 10,
wherein a capacitance ratio of the capacitive voltage divider configuration is defined by a depth of the recess.

12. The memory cell of claim 1,
wherein the semiconductor layer comprises a well region, and wherein the recess is formed in the well region.

13. The memory cell of claim 1,
wherein the semiconductor layer comprises a well region and a deep well region, wherein the well region is disposed between the first and second source/drain regions and the deep well region, and wherein the recess is formed in the well region, wherein a portion of the well region separates the gate isolation disposed in the recess from the deep well region.

14. The memory cell of claim 13, further comprising:
an isolation structure disposed in the semiconductor layer, wherein the isolation structure extends through the well region to the deep well region.

15. The memory cell of claim 1,
wherein the first electrode is in direct physical contact with the floating gate, and/or
wherein the first electrode is in direct physical contact with the gate isolation.

16. The memory cell of claim 1,
wherein the spontaneously polarizable layer is in direct physical contact with the gate isolation.

17. The memory cell of claim 1,
wherein the spontaneously polarizable layer has a lateral dimension that is greater than a lateral dimension of the first electrode; and/or
wherein the spontaneously polarizable layer has a lateral dimension that is greater than a lateral dimension of the floating gate.

18. The memory cell of claim 1,
wherein the spontaneously polarizable layer has a first lateral dimension in a first region thereof and a second lateral dimension different from the first lateral dimension in a second region thereof.

19. A memory cell comprising:
a field-effect transistor structure, the field-effect transistor structure comprising a gate structure to control a current flow in a channel, the gate structure comprising a gate isolation and a floating gate, wherein at least a part of the gate structure extends from a surface of a semiconductor layer into the semiconductor layer; and a capacitive memory structure, the capacitive memory structure comprising at least two electrodes and a spontaneously polarizable layer disposed between the at least two electrodes, wherein at least a first electrode of the at least two electrodes is at least partially disposed in a recess of the semiconductor layer and wherein the spontaneously polarizable layer is disposed over the surface of the semiconductor layer.

20. A memory cell arrangement comprising:

a plurality of memory cells arranged in an AND configuration or in a NOR configuration; each memory cell of the plurality of memory cells comprising:

a field-effect transistor structure, the field-effect transistor structure comprising a gate structure to control a current flow in a channel, the gate structure comprising a gate isolation and a floating gate, wherein at least a part of the gate structure extends from a surface of a semiconductor layer into the semiconductor layer; and a capacitive memory structure, the capacitive memory structure comprising at least two electrodes and a spontaneously polarizable layer disposed between the at least two electrodes, wherein at least a first electrode of the at least two electrodes is at least partially disposed in a recess of the semiconductor layer and wherein the spontaneously polarizable layer is disposed over the surface of the semiconductor layer.

\* \* \* \* \*